US005144194A

United States Patent [19]

Agosti et al.

[11] Patent Number: 5,144,194

[45] Date of Patent: Sep. 1, 1992

[54] QUASI-OPTICAL GYROTRON HAVING ANGULARLY SPACED QUASI-OPTICAL RESONATORS LYING IN A COMMON PLANE

[75] Inventors: Giorgio Agosti, Wettingen; Hans-Günter Mathews, Oberehrendingen, both of Switzerland

[73] Assignee: Asea Brown Boveri Ltd., Baden, Switzerland

[21] Appl. No.: 511,311

[22] Filed: Apr. 19, 1990

[30] Foreign Application Priority Data

Apr. 19, 1989 [CH] Switzerland .................... 1490/89-6

[51] Int. Cl.[5] .................... H01J 23/18; H01J 25/02; H03B 9/01

[52] U.S. Cl. .................... 315/005; 315/5.39; 331/79

[58] Field of Search .................... 315/4, 5, 5.16, 5.29, 315/5.31, 5.39, 39; 333/227; 331/79; 372/2

[56] References Cited

U.S. PATENT DOCUMENTS

| | | | |
|---|---|---|---|
| 4,559,475 | 12/1985 | Manheimer et al. | 315/4 |
| 4,661,744 | 4/1987 | Mourier | 315/4 |
| 4,926,094 | 5/1990 | Bondeson et al. | 315/5 |

FOREIGN PATENT DOCUMENTS

| | | | |
|---|---|---|---|
| 13532 | 1/1986 | Japan | 315/4 |
| 27142 | 1/1989 | Japan | 315/4 |
| 664045 | 1/1988 | Switzerland . | |
| 670728 | 6/1989 | Switzerland | 315/5 |
| 497893 | 8/1978 | U.S.S.R. | 315/4 |
| 749278 | 9/1982 | U.S.S.R. | 315/4 |

OTHER PUBLICATIONS

Treacy, E. B., "The two cone resonator"; *Proceeding of the IEEE;* vol. 54, No. 4; Apr. 1966; pp. 555-560; copy in 331/79.

International Journal of Infrared and Millimeter Waves, vol. 7, No. 11, 1986, Plenum Publishing Corporation A. Perrenoud et al.: "Low power measurements of the quality factor of an open resonator with stepped mirrors". pp. 1813-1822, see abstract, p. 1814, lines 2-8.

International Journal of Electronics, vol. 61, No. 6, Dec. 1986, (London, GB) G. Mourier et al.: "A 100 Ghz gyrotron results and future prospects", pp. 715-727, see page 724, paragraph 4; FIG. 8.

Das Gyrotron, Schlusselkomponente Fur Hochleistungs-Mikrowellensender pp. 303-307.

*Primary Examiner*—Eugene R. LaRoche
*Assistant Examiner*—Benny T. Lee
*Attorney, Agent, or Firm*—Oblon, Spivak, McClelland, Maier & Neustadt

[57] ABSTRACT

A quasi-optical gyrotron for the production of electromagnetic radiation in the form of mm waves has several high-power resonators. Resonators have two mirrors each lying on a resonator longitudinal axis aligned perpendicular to an electron beam axis. The electron beam axis is thus given by the path of the electrons forced to gyration by a static magnetic field. Resonator longitudinal axes are basically in a common plane perpendicular to the electron beam axis and form an angle greater than zero.

11 Claims, 2 Drawing Sheets

QUASI-OPTICAL GYROTRON HAVING ANGULARLY SPACED QUASI-OPTICAL RESONATORS LYING IN A COMMON PLANE

BACKGROUND OF THE INVENTION

1. Field of the Invention

This invention relates generally to a quasi-optical gyrotron for the production of electromagnetic radiation in the form of mm waves and particularly to a quasi-optical gyrotron, in which electrons running on an electron beam axis are forced to gyrate by a static magnetic field aligned parallel to the electron beam axis and excite an electromagnetic alternating field in a high-power resonator.

2. Description of the Background

A quasi-optical gyrotron is known, e.g., from Swiss Patent 664045 or the article "The Gyrotron, Key Component for High-Power Microwave Transmitters," H. G. Mathews, Minh Quang Tran, Brown Boveri Review 6-1987, pp. 303–307. In comparison with the conventional cylindrical gyrotron this gyrotron has the advantage that it can produce a greater power. The reason for this resides, i.a., in the following facts:

1. Since the resonator is not coaxial, but perpendicular to the electron beam axis, it can be dimensioned independently of the "klystron part." Especially the radiation exposure of the resonator mirrors and HF gaps can be reduced by enlarging the diameter.

2. The energy present in the resonator can have two outputs.

Basically it is desirable that the gyrotron have as great an efficiency as possible. Therefore, in the above-cited publications it is proposed to place a control resonator ahead of the power resonator. The control resonator bunches ("prebunching") the electrons so that the electrons arrive with the suitable phase angle in the subsequent power resonator.

But besides the improvement of efficiency, the actual power of the output radiation is of special interest. It has been shown that the development of high-power gyrotrons (P greater than 500 kW continuous wave) reaches its limits due to the load carrying capacity of the gaps, by which the radiation produced in the resonator is output from the evacuated tube. Also with optimal transparency, these gaps would have to be heated in the desired power range so greatly that they would break in a very short time.

It is indeed known that the load limit can be pushed back if the gap is made from two separated disks, between which a liquid circulates and thus provides laminar cooling. But such a measure is not sufficient if it is a question of achieving radiation power in the megawatt (MW) range.

An important aspect with gyrotrons is the large but unavoidable expense of auxiliary units (superconducting coils, vacuum units, power supply). Of course, they should be kept as small as possible and at the same time achieve their function. This, e.g., is the case if a unit be used for different purposes.

SUMMARY OF THE INVENTION

One object of this invention is to provide a gyrotron producing radiation power while keeping the equipment expense at a minimum.

Another object of this invention is to provide a gyrotron having two or more power resonators.

A further object of the invention is to provide a gyrotron having two power resonators with longitudinal axis perpendicular to the electron beam axis and mutually rotated by an angle greater than 0°.

A still further object of this invention to provide a gyrotron having resonators with movable mirrors.

These and other objects of the invention are achieved by providing at least one other high-power resonator, which comprises two other mirrors lying on another resonator longitudinal axis. The other resonator longitudinal axis is also perpendicular to the electron beam axis and thus is aligned so that the first and other resonator longitudinal axes are mutually rotated by an angle greater than zero.

The core of the invention is that with a given maximum load of a gap the total output power is increased by having the available output gap surface being multiplied in a clever way. Since the energy of the electron beam can be multiplied without great technical problems, another alternating field of the same strength can be built up in any of the largely independent power resonators. Thus the total stored energy and the number of HF gaps available for output is multiplied by the number of power resonators.

The improvement according to the invention is thus achieved with the previously known gap technology and is essentially based on the special design of the quasi-optical gyrotron.

An advantage of the invention is that the entire unit can be used better, since the quasi-optical gyrotron with its modular design can be expanded by the incorporation of resonators with different frequencies. This is important, for example, in production engineering applications.

It is to be noted that the resonators according to the invention achieve an object completely different from the known control resonators responsible for prebunching of electrons. In contrast with the so-called prebunching resonators, the power resonators according to the invention do not increase the efficiency of the gyrotron but its total radiation power and flexibility.

Preferably the resonators have at least one tiltable mirror so that each resonator can be deactivated by an easy tipping of the resonator mirror to increase the efficiency of the remaining active resonators.

BRIEF DESCRIPTION OF THE DRAWINGS

A more complete appreciation of the invention and many of the attendant advantages thereto will be readily obtained as the same becomes better understood by reference to the following detailed description when considered in connection with the accompanying drawings, wherein.

DESCRIPTION OF THE PREFERRED EMBODIMENTS

Figure 1:
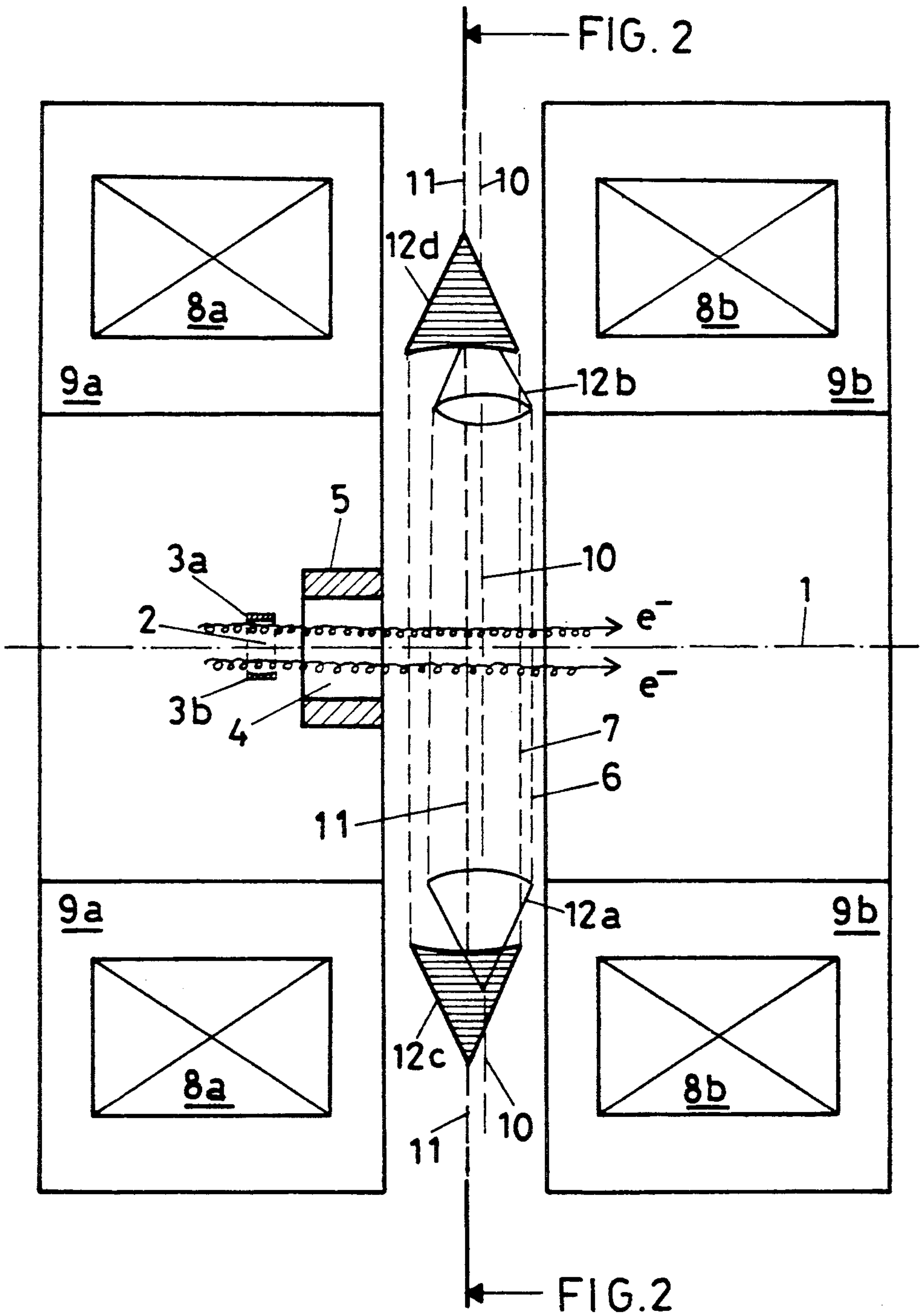
FIG. 1 is a longitudinal section through the quasi-optical gyrotron according to the invention.

Referring now to the drawings, wherein like reference numerals designate identical or corresponding parts throughout the several views, and more particularly to FIG. 1 thereof, which shows the essential part of a quasi-optical gyrotron according to the invention in longitudinal section. Electrons e−run (in FIG. 1 from left to right) along an electron beam axis in a helical path first through a control resonator (prebuncher) 2, represented by two mirrors 3a, 3b and a drift zone 4, covered by a magnetic shielding body 5 before they enter a first and a second resonator 6 and 7. Electrons e⁻are produced and accelerated by an electron gun (not shown in FIG. 1).

Two superconducting coils 8a, 8b, which are each placed in a container 9a, 9b, produce a static magnetic field, aligned parallel to electron beam axis 1, by which electrons e⁻are forced to gyrate with a corresponding cyclotron frequency. Coils 8a and 8b are placed around the electron beam axis at a distance from each other equal to their radius (so-called Helmholtz arrangement). The entire unit is placed in an evacuated vessel (not shown in FIG. 1).

In practice, the two coils are supported opposite one another by a supporting structure, which in the gap between coils 8a, 8b is provided with bores for resonators 6, 7.

Except for the resonators, the parts described so far basically are not different from the prior art as indicated, e.g., in Swiss patent 664045 cited above. On the other hand, the arrangement of power resonators described below is new.

According to the preferred embodiment, two high-power resonators 6 and 7 are placed between the two coils 8a and 8b. Each of the two resonators 6, 7 comprises two mirrors 12a, 12b and 12c, 12d, respectively which are opposite one another on a resonator longitudinal axis 10, 11 of the respective resonator 6,7. The two resonator longitudinal axes 10, 11 are perpendicular to electron beam axis 1. Moreover, they are basically in a common plane.

Figure 2:
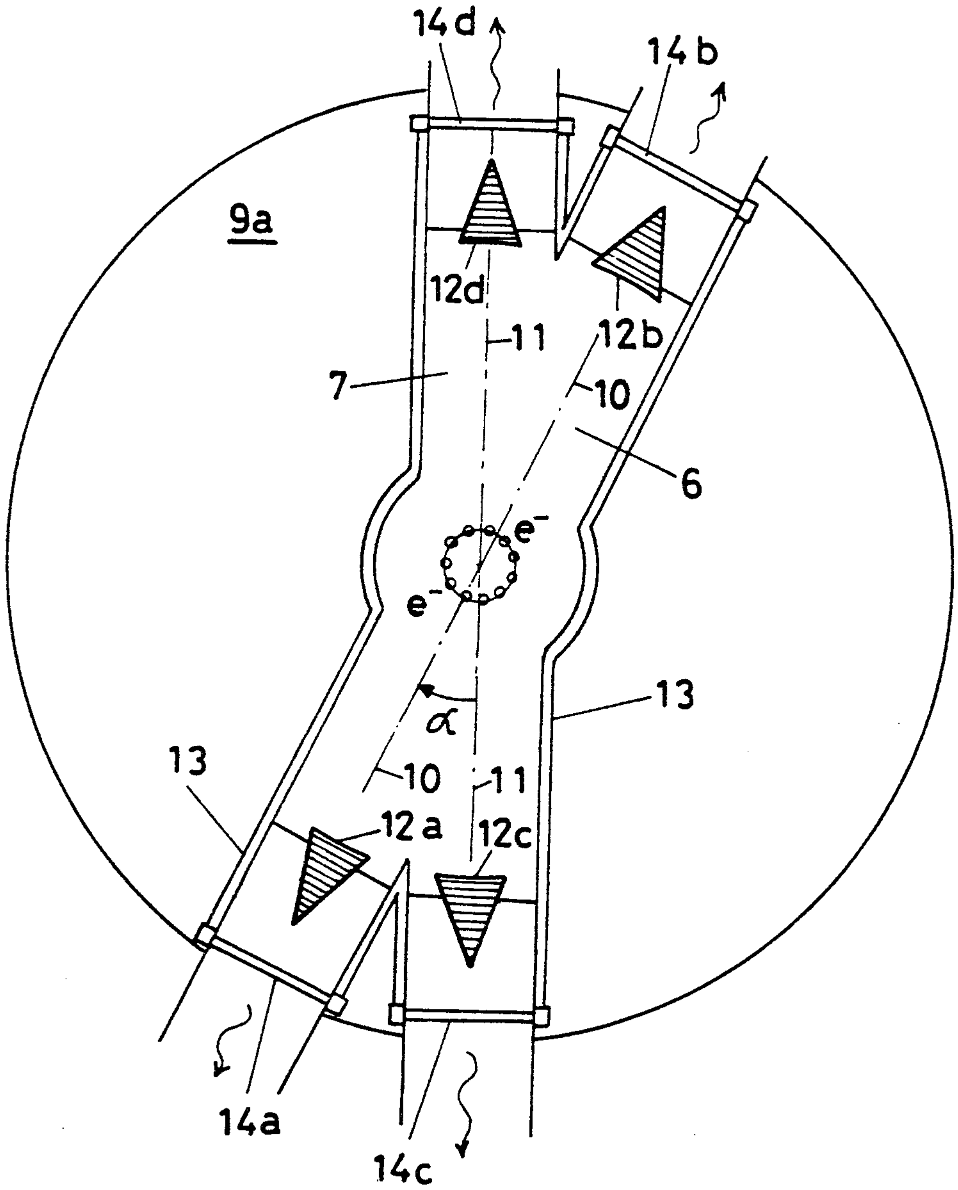
FIG. 2 is a cross section through the resonator part of the gyrotron shown in FIG. 1.

FIG. 2 shows a cross section through the resonator block along the line shown in FIG. 1. Thus in the representation of FIG. 2 the electron beam axis is perpendicular to the plane of projection so that electrons e⁻run toward the observer.

Resonator longitudinal axes 10 and 11 intersect electron beam axis 1 and are mutually rotated by an angle $\alpha$ greater than zero. Angle $\alpha$ is thus the angle between a first plane, spanned by a first resonator longitudinal axis 10 and electron beam axis 1, and a second plane, spanned by second resonator longitudinal axis 11 and electron beam axis 1.

Resonators 6, 7 are placed in an evacuated vessel 13, which is provided with four gaps 14a, 14b, 14c, 14d which are transparent to mm waves. The desired electromagnetic radiation can leave through any of these gaps 14a, 14b, 14c, 14d.

The electrons entering resonators 6, 7 with precisely defined cyclotron frequency and phase angle simultaneously excite an electromagnetic alternating field in each resonator. According to the preferred embodiment, the alternating fields oscillate with the same frequency, which typically is greater than 100 GHz. This means that mirrors 12a, 12b, 12c, 12d are basically all the same and are the same distance from one another in pairs.

Each mirror is fastened by a holder suitably attached to vessel 13. Since the alternating field oscillating in the resonator is outputted each time on the edge of the mirror, the holder and back side of the mirror must be designed so that the electromagnetic radiation can leave as unhindered as possible through the respective gap located behind the mirror.

According to the preferred embodiment at least one of the two mirror pairs 12a, 12b and 12c, 12d of resonators 6 and 7, respectively is movable relative to the corresponding resonator longitudinal axis.

This applies to all the mirrors in the example according to FIG. 2. By a suitably made holder, for example, mirrors 12a and 12b or 12c and 12d (and thus especially also their mirror surfaces) can be tilted and moved with respect to respective resonator longitudinal axis 10 or 11. In this way the mirrors of a resonator can be adjusted to one another and to the resonance frequency. In addition, the quality factor $Q_1$, of resonator 6 can be reduced or matched.

If an alternating field is excited at the time in the two resonators 6, 7, it cannot be expected that the two alternating fields will also oscillate equally strongly. Therefore, it is necessary in practice that the quality factors, $Q_1$ and $Q_2$ of the two resonators 6 and 7 be adjusted to one another by a very slight tipping of mirrors 12a and 12b, so that an equally strong maximum radiation will be emitted through all four gaps 14a, 14b, 14c, 14d. In this case, the total emitted radiation at the specified maximum load of a gap is also at a maximum.

Angle $\alpha$ at which the two resonator longitudinal axes 10 and 11 intersect, represents an important aspect of the invention. Its size has a substantial influence on the efficiency of the gyrotron. This is to be explained now in greater detail.

In a quasi-optical gyrotron with only one high-power resonator the cyclotron frequency of the electrons, resonance frequency of the resonator and phase angle of the electrons entering the resonator must be tuned to one another. The phase angle of the gyrating electrons is suitably prepared by prebunching in the control resonator 2 and subsequent drift zone 4 so that the electrons interact optimally with the oscillating electromagnetic alternating field in the resonator. This guarantees the optimal efficiency.

An important factor in this optimal adjustment is the correct tuning to the direction of the resonator longitudinal axis. But this represents a problem if two noncoincident resonator longitudinal axes are present, as is the case with the invention. According to the preferred embodiment this problem is solved by keeping angle $\alpha$ as small as possible. If now an alternating field is to be excited in the two resonators 6 and 7, the phase angle of the electrons is adjusted so that it is optimal for the angle bisector (of the smaller of the two angles $\alpha$ and $180^\circ-\alpha$) between the two resonator longitudinal axes 10 and 11. In this way the electrons excite the two alternating fields approximately equally strongly. An equipartition of the energy as extensive as possible to the two resonators 6 and 7 can be achieved by additional tipping of the mirrors in above-described way.

By way of indication, an arrangement with minimum angle is shown in FIG. 2. It is determined, on the one hand, by the distance of the two mirrors 12a and 12b or 12c and 12d of resonator 6 or 7, and, on the other hand, by the diameter of neighboring mirrors 12a and 12c or 12b and 12d and the space between the wall of vessel 13 and the edge of the respective mirror necessary for the output of the electromagnetic radiation.

The following numerical example is to serve as an orientation aid for angle $\alpha$. At a mirror distance of 800 mm and a mirror diameter of 65 mm, an inside diameter of the vessel (bore) of about 145 mm is necessary. For structural mechanical reasons (flange connections) a minimum angle $\alpha$ on the order of magnitude of 30° can be achieved.

Angle $\alpha$ can, of course, can also be reduced by increasing the mirror distance. Since, because of the alternating field diverging in the axial direction, somewhat larger mirrors and gaps are then necessary, thus even more power can be outputted. These technical advantages are to be balanced from case to case against the economic disadvantages of the need for more space and higher production costs.

What has been said for the case of resonators of the same frequency, also applies analogously for the variants with different frequency explained below.

A first variant consists, e.g., in that resonator 7 oscillates at a frequency that differs only slightly from that of resonator 6. The corresponding frequency shift is achieved, e.g., by the mirror distance of one of the two almost equal resonators 6, 7 being shifted at most by a half wavelength of the excited alternating field.

The size of the frequency difference depends basically on the free spectral range of the resonator. If the two mirrors 12*a*, 12*b* of resonator 6 are at a distance of, e g., 400 mm and the electromagnetic alternating field has a wavelength of 1 mm, 800 half wavelengths occur between the mirrors. The relative, free spectral range is thus about 1/800, i.e., about 1% of the resonance frequency.

A possible field of use of the gyrotron with only slightly differing mm waves is the heating of a plasma in nuclear fusion. Especially closely neighboring regions of the plasma can be heated in this way.

A second variant provides a resonator 7 with a frequency which is in a harmonic ratio to that of resonator 6. The one alternating field thus oscillates with a frequency which is the multiple of that of the other alternating field. Preferably the ratio is 2:1.

So far it has always been assumed that the two resonators 6 and 7 are in operation at the same time. But a quasi-optical gyrotron according to the invention can also operate perfectly well with only one of the two resonators. This will then offer advantages especially if the two resonators have different frequencies, which each are tuned to a specific use. With an extremely small additional expense, a broad field of application can be covered. In this case, the present auxiliary equipment is better used.

If only one of the two resonators is in operation, the other is put out of operation by tipping of its mirror. Moreover, the phase angle of the electrons is optimally tuned to the running resonator. This guarantees an optimal efficiency.

Angle $\alpha$ in this case is basically not subjected to any limitation. Especially the two resonator longitudinal axes 10 and 11 easily can be aligned perpendicular to one another ($\alpha=90°$), which is exceptionally advantageous in regard to operation.

Resonator longitudinal axes 10, 11 are either in the same plane (which is perpendicular to the electrode beam axis), or are easily shifted in the direction of the electron beam axis. How the geometric arrangement is to be in a specific case depends on different factors. The following points, i.e., are important:

1. Basically all power resonators must find space between the two coils in Helmholtz arrangement.

2. Each resonator 6, 7 must preserve a certain distance from containers 9*a*,9*b*, so that the alternating field, in principle not limited laterally, will not be too greatly disturbed.

3. If the resonator longitudinal axes are shifted a suitable distance, the electrons for the two resonators can achieve the correct phase angle.

Because of the reduced width of the gap between the coils, the resonator longitudinal axes basically are in the same plane.

In the embodiments explained by the figures only quasi-optical gyrotrons with two power resonators have been shown. But it is clear that according to the invention gyrotrons with three or even more power resonators can be achieved.

In the embodiments explained by the figures electromagnetic radiation is output at each mirror. But this is not imperative for the invention. In certain applications, it can be quite desirable that one or more resonators to output power only at one mirror. In this case an HF gap is placed behind only one of the two mirrors.

Although a wavelength range of mm waves is indicated it is not limited thereto. It typically comprises wavelengths of about 1 mm and definitely is one to two decades wide.

Control resonator 2 in FIG. 1 may be left out, if the prebunching is not desired.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A quasi-optical gyrotron for the production of mm electromagnetic radiation in form of mm waves, comprising:

an inner space formed by an evacuated gyrotron chamber with a gyrotron main axis; said inner space being delimited from an outer space by a housing of said gyrotron chamber;

first means disposed in said inner space for generating a beam of electrons which run on an electron beam axis aligned parallel to said gyrotron main axis;

second means disposed in said inner space for producing a static magnetic field; said magnetic field being aligned parallel to said electron beam axis; said magnetic field causing said electrons running on said electron beam axis to gyrate;

a first high-power resonator disposed in said inner space including two first mirrors lying on a first resonator longitudinal axis aligned perpendicular to said electron beam axis; said first mirrors defining a first resonator cavity; said first mirrors being at a certain distance from one another along said first resonator longitudinal axis and having a lateral extension perpendicular to said first resonator longitudinal axis;

at least one second high-power resonator disposed in said inner space including two second mirrors lying on a second resonator longitudinal axis aligned perpendicular to said electron beam axis; said second mirrors defining a second resonator cavity; said second mirrors being at a certain distance from one another along said second resonator longitudinal axis and having a lateral extension perpendicular to said second resonator longitudinal axis;

said beam of electrons exciting a first and at least one second electromagnetic alternating field corresponding to electromagnetic radiation in said first and at least one second high-power resonators, respectively;

said first and second resonator longitudinal axes lying in a common plane and oriented at an angle therebetween which is greater than zero; whereby said first and second high-power resonators have a central part of said first and second resonator cavity in common, through which said electron beam passes; and third means disposed in said inner space for releasing said electromagnetic radiation into said outer space in the form of mm waves at said first and second mirrors.

2. A quasi-optical gyrotron according to claim 1, wherein each of said first and second pairs of mirrors are tuned to a specific first and second frequency, respectively.

3. A quasi-optical gyrotron according to claim 1, wherein said second means comprises two identical coils with a coil radius; said two coils each being aligned coaxially with respect to said electron beam axis, and said two coils being separated along said electron beam axis by a distance which equals said coil radius; said first and second high-power resonators being arranged between two said coils.

4. A quasi-optical gyrotron according to claim 3, wherein electrons of said electron beam have a definite phase angle when passing said first and second high-power resonators; and said phase angle of said electrons is adjusted with respect to a bisector of said first and second high-power resonator longitudinal axes by being pre-bunched in a control resonator and a drift zone; said control resonator and said drift zone being arranged along said electron beam axis in series and being closer to said first means than said first and second high-power resonators.

5. A quasi-optical gyrotron according to claim 1, wherein said angle between said first and second longitudinal resonator axes is minimized;

said angle between said first and second longitudinal resonator axes is so small that said electromagnetic alternating field in both of said high-power resonators is excited at the same time and said corresponding electromagnetic radiation in the form of mm waves is released into said outer space at all mirrors of said first and second resonators.

6. A quasi-optical gyrotron according to claim 5, wherein exactly one second resonator is included and said angle is about 30°.

7. A quasi-optical gyrotron according to claim 6, wherein electrons of said electron beam have a definite phase angle when passing said first and second high-power resonators; and said phase angle of said electrons is adjusted with respect to a bisector of said first and second high-power resonator longitudinal axes by being pre-bunched in a control resonator and a drift zone; said control resonator and said drift zone being arranged along said electron beam axis in series and being closer to said first means than said first and second high-power resonators.

8. A quasi-optical gyrotron according to claim 1, wherein each of said high-power resonators includes fifth means for tilting at least one of said first and second mirrors relative to the respective resonator longitudinal axis to adjust a quality factor and a resonance frequency of said resonator.

9. A quasi-optical gyrotron according to claim 8, wherein said tiltable mirrors are adjusted relative to the respective resonator longitudinal axis so that only one of said first or second electromagnetic alternating field can be excited in said resonators.

10. A quasi-optical gyrotron according to claim 1, wherein said first and second alternating fields in said first and second high-power resonators are respectively excited to oscillate with first and second frequencies that differ from one another.

11. A quasi-optical gyrotron according to claim 10, wherein said first and second alternating fields in said first and second resonators are respectively excited to oscillate with said first and second frequencies which are in harmonic ratio to one another.

* * * * *